United States Patent
Ho et al.

[11] Patent Number: 6,059,587
[45] Date of Patent: May 9, 2000

[54] CARD CONNECTOR

[75] Inventors: Yu-Ming Ho, Pen-Chiao; Kevin Chou, Taipei Hsien, both of Taiwan

[73] Assignee: Hon Hai Precision Ind. Co., Ltd., Taipei Hsien, Taiwan

[21] Appl. No.: 09/165,768

[22] Filed: Oct. 2, 1998

Related U.S. Application Data

[63] Continuation-in-part of application No. 08/956,347, Oct. 23, 1997.

[30] Foreign Application Priority Data

Oct. 2, 1997 [TW] Taiwan .................................. 86216886

[51] Int. Cl.$^7$ .................................................... H01R 13/62
[52] U.S. Cl. ............................................ 439/159; 439/152
[58] Field of Search ...................... 439/159, 160, 439/152, 153, 154, 155, 156, 157, 158; 361/684, 685, 686

[56] References Cited

U.S. PATENT DOCUMENTS

| | | | |
|---|---|---|---|
| 5,536,180 | 7/1996 | Ishida et al. ............................ | 439/159 |
| 5,558,527 | 9/1996 | Lin .......................................... | 439/155 |
| 5,871,365 | 2/1999 | Kajiura .................................... | 439/159 |

*Primary Examiner*—Paula Bradley
*Assistant Examiner*—Alexander Gilman

[57] ABSTRACT

A card ejection mechanism for a card connector including a guiding frame, a rear actuating arm, a spring for urging the rear actuating arm rearward, a front actuating arm, and a follower pivotably connected to the rear actuating arm. The guiding frame has an inner space, a positioning groove within the inner space, and a channel. The rear actuating arm is slidably received in the inner space between a forward and a rearward stagnation positions. The front actuating arm is slidably received in the channel and has a front end adapted to operate a card ejection plate. The follower has a projection extending into the positioning groove and is moveable together with the rear actuating arm along the positioning groove to actuate the front actuating arm in a controlled manner. In one configuration where the rear actuating arm is in the forward stagnation position, an actuation of the rear actuating arm moves the rear actuating arm to the rearward stagnation position without ejecting a card inserted in the card connector. In another configuration where the rear actuating arm is in the rearward stagnation position, a manipulation of the rear actuating arm may move the rear actuating arm along a specific part of the guiding groove from the rearward stagnation position to the forward stagnation position again without ejecting a card inserted in the card connector.

2 Claims, 16 Drawing Sheets

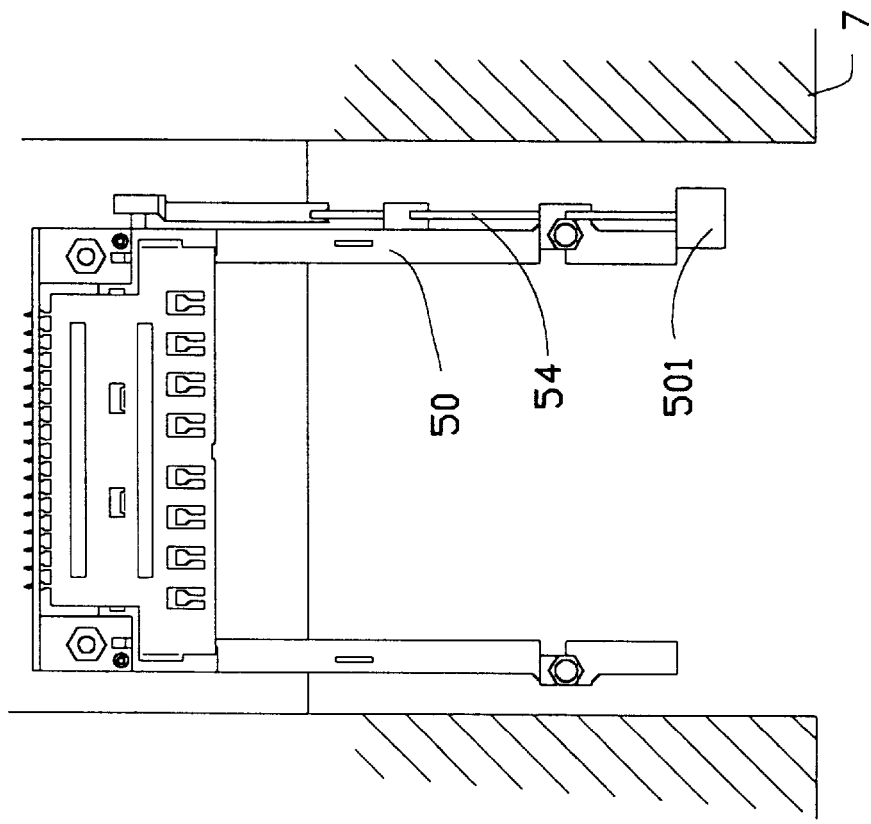
FIG.2 (A) (PRIOR ART)
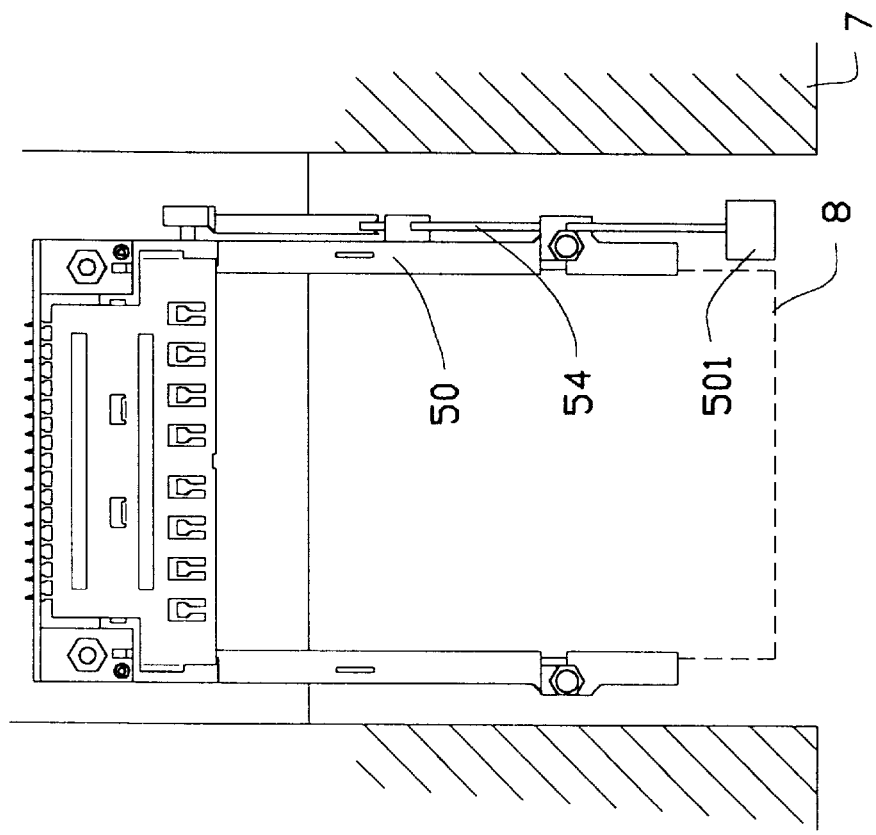
FIG.2 (B) (PRIOR ART)

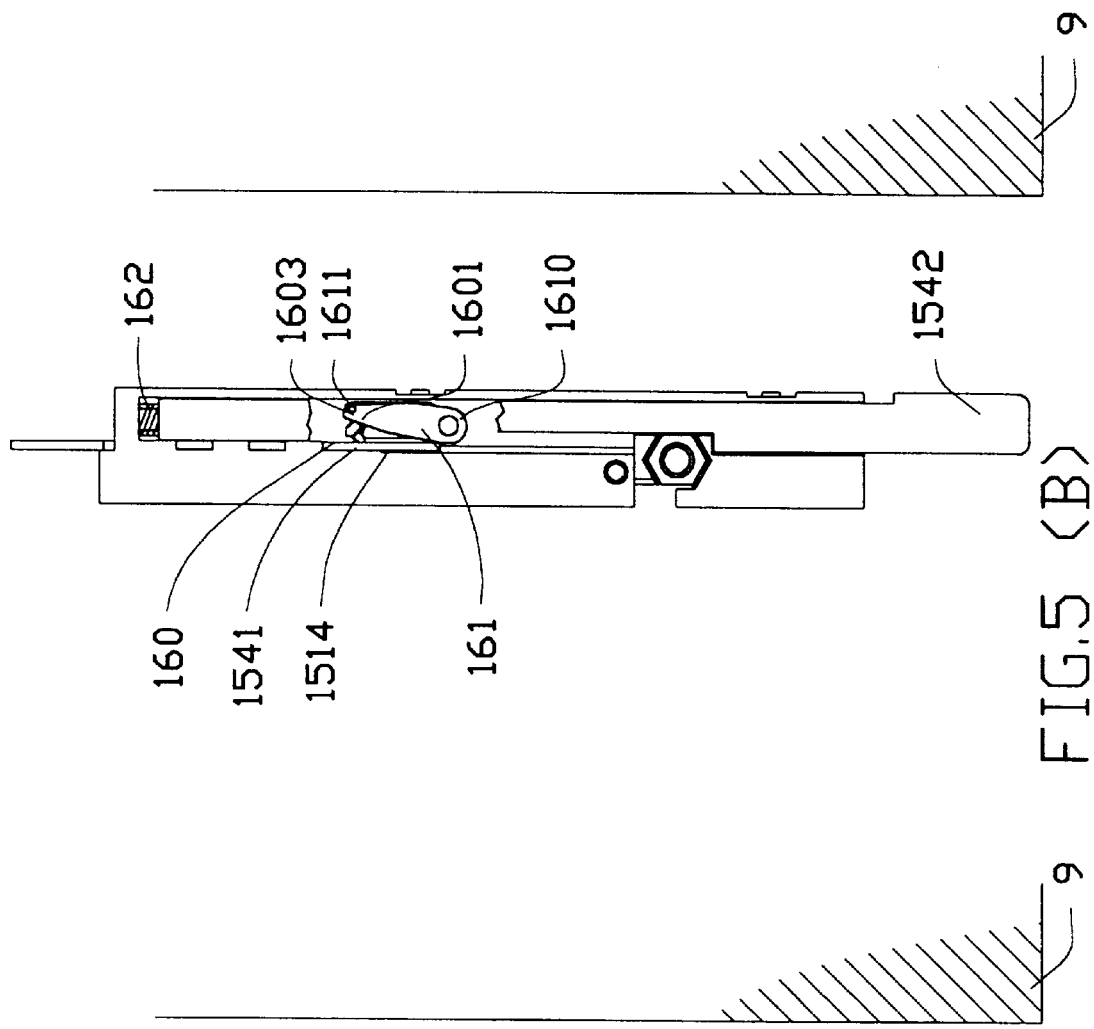
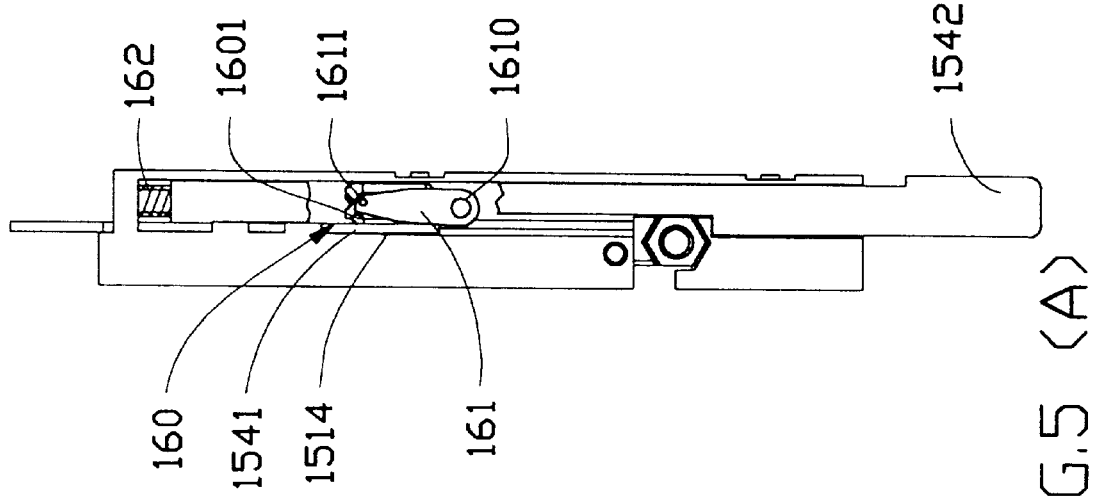
FIG.5 (A)
FIG.5 (B)

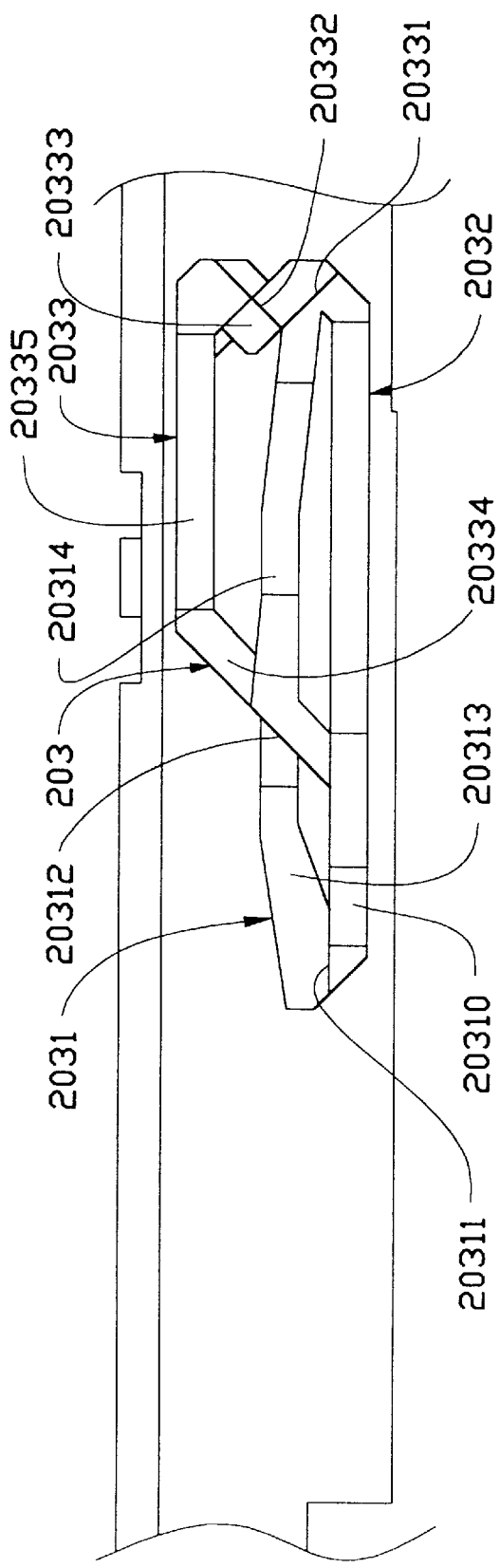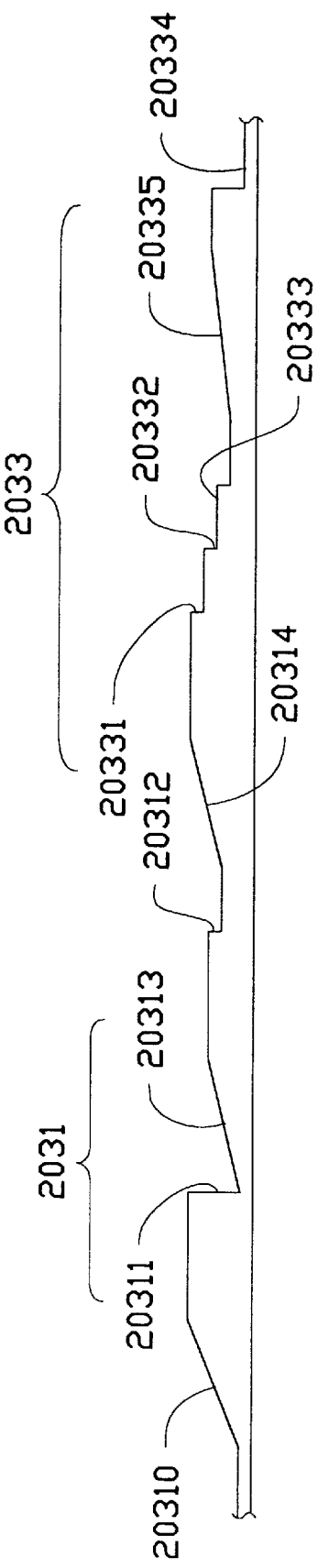
FIG.9 (A)
FIG.9 (B)

CARD CONNECTOR

This application is a continuation-in-part of application Ser. No. 08/956,347 filed on Oct. 23, 1997.

BACKGROUND OF THE INVENTION

The present invention relates to a card connector, and particularly to a card ejection mechanism for a card connector.

Following the trend of reduced computer size, present laptop computers are often equipped with card connectors for connecting memory cards or I/O cards thereto. Such card connectors are disclosed in Taiwan Patent Application Nos. 80207499, 81216447, 81217278, 82205600, 83202199, 83107162, 8328140 and U.S. Pat. Nos. 4,818,239, 4,878, 856, 4,810,203, 5,085,590, 5,149,276, 5,176,523, 5,286,207, 5,290,174, 5,324,204 and 5,334,046.

The above mentioned conventional card connectors share a common disadvantage requiring further improvement, a detailed description of which is given below.

FIGS. 1 to 2(B) respectively show components constituting a conventional card connector and two different operational states of the connector when it is mounted in a computer.

FIG. 1 shows that the conventional card connector generally comprises a dielectric housing 6 having two side arms 60 each forming a rear engaging rod 602. A number of contacts 601 are fixed to the housing 6 between the two side arms 60. The contacts 601 are soldered to a daughter board 62 which is connected to a mother board (not shown) of the computer. A grounding plate 64 is mounted on the housing 6 and soldered to the daughter board 62. The grounding plate 64 is used to transfer electrostatic charges carried by a memory or I/O card inserted into the connector to a ground potential. Two guiding frames 50 are connected to the housing 6 by engaging with the engaging rods 602 of the housing 6. The guiding frames 50 guide the insertion of a card into the connector to electrically and mechanically connect with the contacts 601 after first contacting the grounding plate 64. A card ejection mechanism 5 includes an actuating arm 54 slidably received in the left guiding frame 50. A handle 501 is attached to a rear end of the actuating arm 54. A mounting plate 53 is fixed between the two frames 50. A link 52 is pivotably mounted to the mounting plate 53 and has a first end connected with the actuating arm 54 and a second end connected with a card ejection plate 51 which is slidably mounted to the mounting plate 53.

FIG. 2(A) shows the connector mounted in a housing 7 of a computer, without a card inserted therein and with the handle 501 at a first position abutting the left guiding frame 50. When a card 8 is inserted into the connector, the card 8 will displace the handle 501 via the ejection plate 51, the link 52 and the actuating arm 54 to move rearwardly away from the frame 50 and reach a second position as shown in FIG. 2(B). When the handle 501 is pushed from the second position toward the frame 50 to return to the first position as shown in FIG. 2(A), the card 8 will be ejected by the ejection plate 51 thereby disengaging from the connector.

Although, the conventional card ejection mechanism 5 has proven to function well, further improvement is required. FIGS. 2(A) and 2(B) show the card connector received in a slot (not labeled) formed by the housing 7 of the computer. When the handle 501 is in the second position for ejecting the card 8, the handle 501 remains within the slot in alignment with the inserted card 8. Since the slot has a small dimension and the handle 501 is a relatively small component, a user intending to eject the inserted card 8 by extending a finger into the slot to depress the handle 501 may not always contact the correct location. The user may mistakenly touch the card 8 instead of the handle 501 and exert a force on the card 8 possibly resulting in damage to either the card 8 or the card connector.

Hence, there is a need for a card connector with an improved card ejection mechanism to eliminate the above-mentioned defect of current card connectors.

Moreover, when a card is in the inserted position, it will be advantageous to permit a user to choose if a subsequent movement of the handle will eject or retract the card.

BRIEF SUMMARY OF THE INVENTION

The main object of the present invention is to provide a card ejection mechanism for a card connector, comprising;

a guiding frame defining an inner space, a positioning groove within the inner space, and a channel;

a rear actuating arm received in the inner space and slidable between forward and rearward stagnation positions;

a spring for urging the rear actuating arm rearward;

a front actuating arm slidably received in the channel and having a front end adapted to operate a card ejection plate; and a follower pivotably connected to the rear actuating arm and having a projection extending into the positioning groove, the follower being moveable together with the rear actuating arm along the positioning groove to selectively actuate the front actuating arm.

In accordance with the present invention, the follower selectively actuates the front actuating arm based on a position of the projection within the positioning groove.

According to one embodiment of the invention, the positioning groove is divided into two main sections defining a closed loop where along one of the two main sections the front actuating arm is actuated.

According to another embodiment of the invention, the positioning groove is divided into three main sections defining two closed loops where along one of the two closed loops the front actuating arm is non-actuated.

Other objects, advantages and novel features of the invention will become more apparent from the following detailed description when taken in conjunction with the accompanying drawings.

BRIEF DESCRIPTION OF THE SEVERAL VIEWS OF THE DRAWING

FIG. 2(A) is a diagrammatic view of the prior art card connector of FIG. 1 received in a housing of a computer and a handle of the connector abutting a guiding frame of the connector;

FIG. 2(B) is a view similar to FIG. 2(A) but a card is inserted into the card connector and the handle rearwardly projects from the guiding frame;

DETAILED DESCRIPTION OF THE INVENTION

Figure 1:
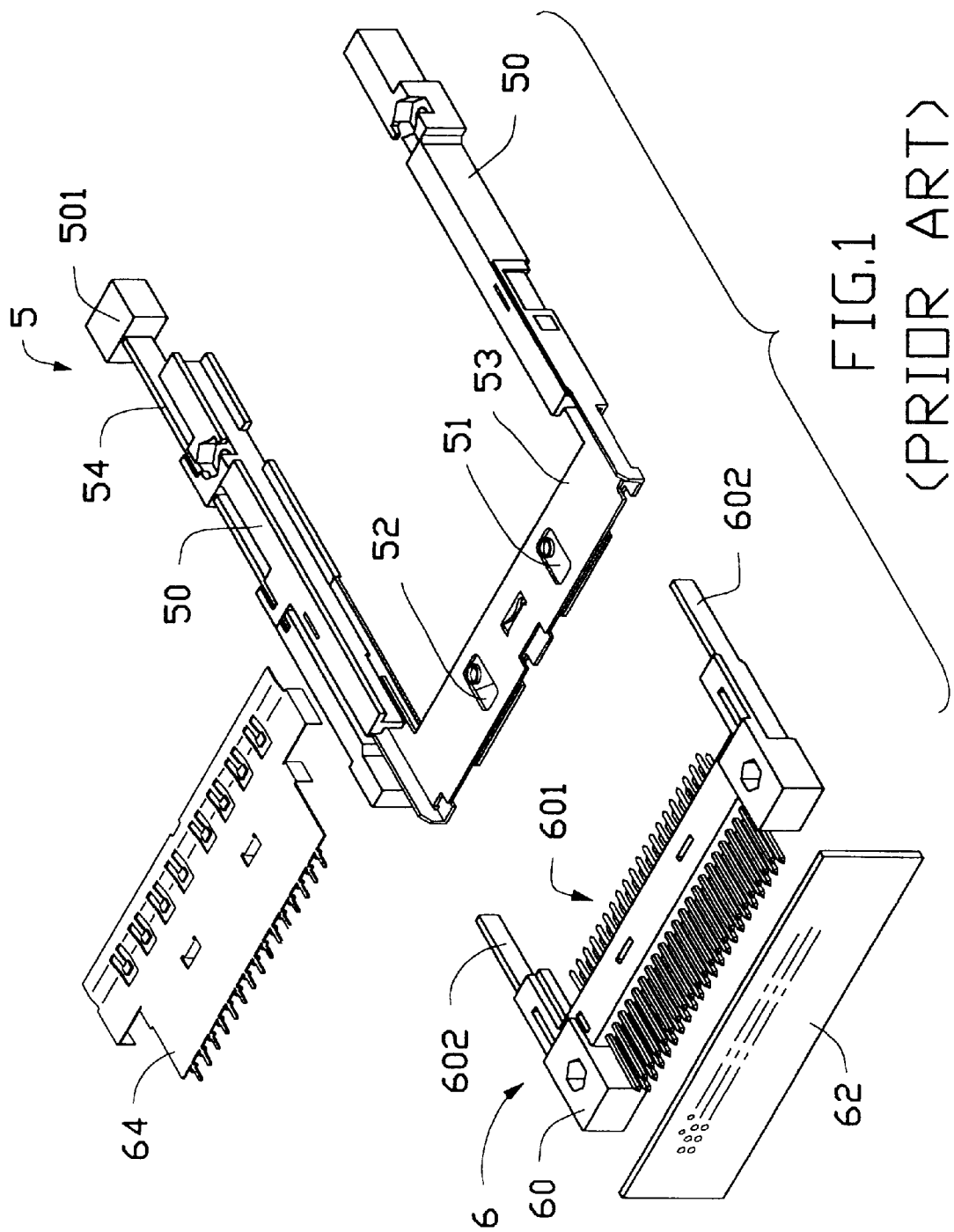
FIG. 1 is an exploded, perspective view of a prior art card connector.
Figure 3:
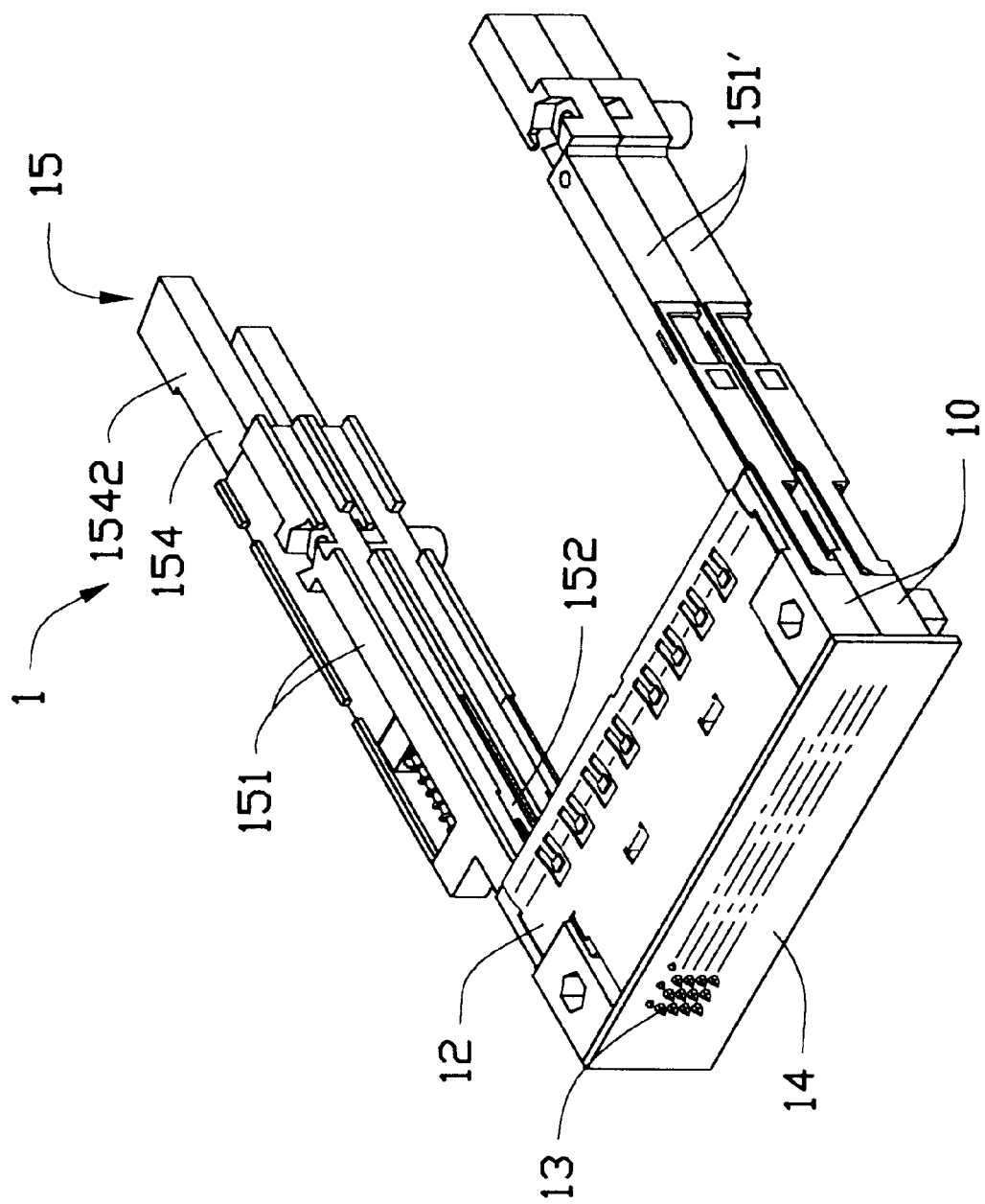
FIG. 3(A) is a perspective view of two card connectors in accordance with a first embodiment of the present invention stacked together, wherein a handle of an upper card connector is positioned to eject an inserted card (not shown)
FIG. 3(B) is an exploded, perspective view of a card ejection mechanism in accordance with the first embodiment of the present invention.
Figure 3:
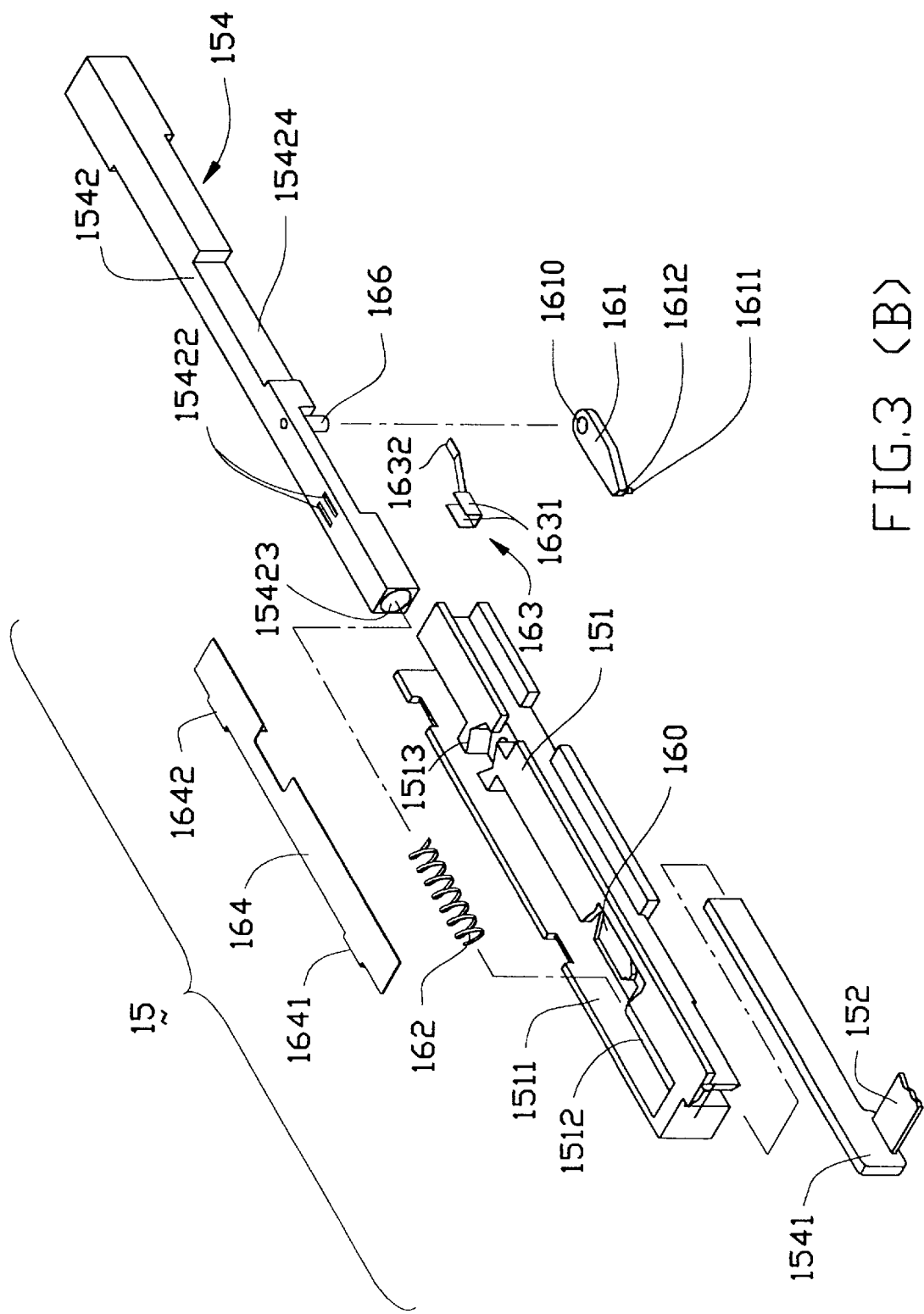

Referring to FIG. 3(A), two card connectors 1 in accordance with the present invention are stacked together. Each connector 1 has a dielectric housing 10, a number of contacts 13 fixed to the housing 10 and soldered to a common daughter board 14, a grounding plate 12 mounted on the housing 10, left and right guiding frame 151, 151' rearwardly extending from two sides of the housing 10 and a rear actuating arm 154 slidably mounted in the left guiding frame 151. The rear actuating arm 154 and the left guiding frame 151 constitute part of a card ejection mechanism 15 in accordance with the present invention. The daughter board 14 is connected to a mother board (not shown) of a computer. The guiding frames 151, 151' guide a card to be inserted into the card connector 1. The rear actuating arm 154 has a handle 1542 for a user to exert a force thereon to eject a card received in the card connector 1. In FIG. 3(A) the handle 1542 of the upper card connector is positioned to receive a force to eject a card (not shown) inserted into the connector.

Referring to FIG. 3(B), in addition to the left guiding frame 151 and the rear actuating arm 154, the card ejection mechanism 15 further includes a front actuating arm 1541, a helical spring 162, a follower 161 and a resilient member 163. A front end of the front actuating arm 1541 is fixed to a link 152 which is connected to a card ejection plate (not shown). Therefore, when the front actuating arm 1541 moves forward toward the daughter board 14, the link 152 will motivate the card ejection plate to move rearward to eject an inserted card. Concerning the detailed structure of the card ejection plate and its connection with the link 152, reference may be made to the inventors' Taiwan Patent Application No. 83202198, which is incorporated herewith for reference. The follower 161 is pivotably mounted to the rear actuating arm 154 by extending a pin 166 fixed to the rear actuating arm 154 through a hole 1610 defined in the follower 161. The resilient member 163 is fixed to the rear actuating arm 154 by interferentially fitting two wings 1631 of the resilient member 163 into two slits 15422 defined in the rear actuating arm 154. The resilient member 163 has a spring tab 1632 which exerts a downward force on the follower 161 after assembly of the follower 161, the resilient member 163 and the rear actuating arm 154. The helical spring 162 is mounted around a stud 1512 located in the frame 151 and extending rearwardly from a front end thereof. The rear actuating arm 154 further defines a recess 15424 between the handle 1542 and the pin 166, and a round depression 15423 in a front end thereof. The frame 151 further defines an inner space 1511 for slidably receiving the rear actuating arm 154 therein and a positioning groove 160 in a bottom wall (not labeled) thereof, and forms a stop 1513 on an upper wall (not labeled) thereof. The stop 1513 engages two steps (not labeled) formed by the recess 15424 of the rear actuating arm 154 thereby limiting the sliding distance of the rear actuating arm 154 relative to the frame 151. A cover 164 is fixedly mounted to a top of the frame 151 defining the inner space 1511 by fixing two locking ears 1641, 1642 into two recesses (not labeled) defined in a side wall (not labeled) of the frame 151, whereby the rear actuating arm 154, the resilient element 163, the follower 161 and the spring 162 are securely received in the inner space 1511. A rear portion of the front actuating arm 1541 is slidably received in a channel 1514 (better seen in FIGS. 5(A)–6(B)) defined by the frame 151 beside the inner space 1511.

Figure 4:
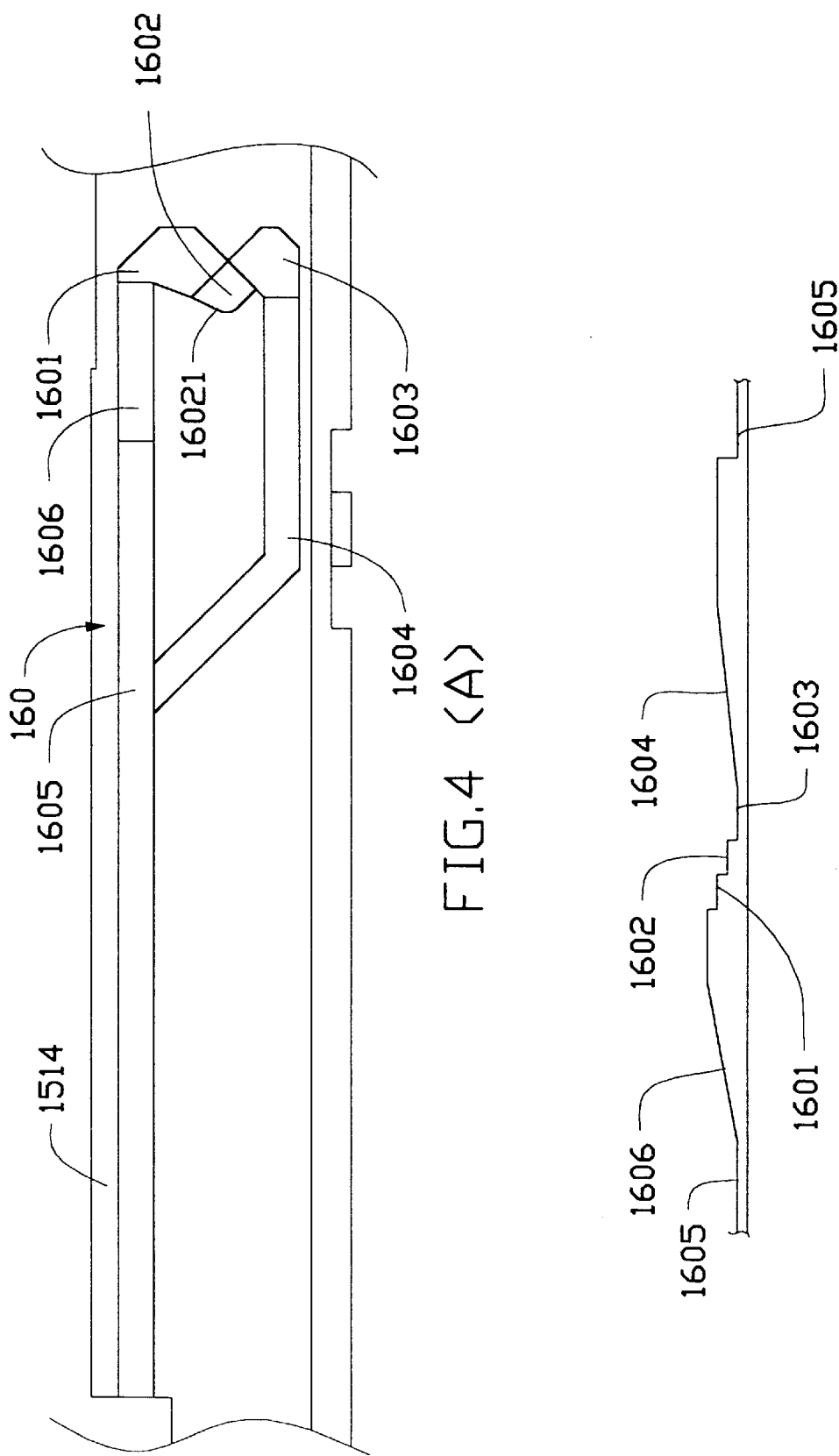
FIG. 4(A) is an enlarged top view of a portion of a guiding frame of the card connector in accordance with the first embodiment of the present invention.
FIG. 4(B) is a diagrammatic view of a variation of a profile of a bottom wall of the guiding frame.
Figure 5:
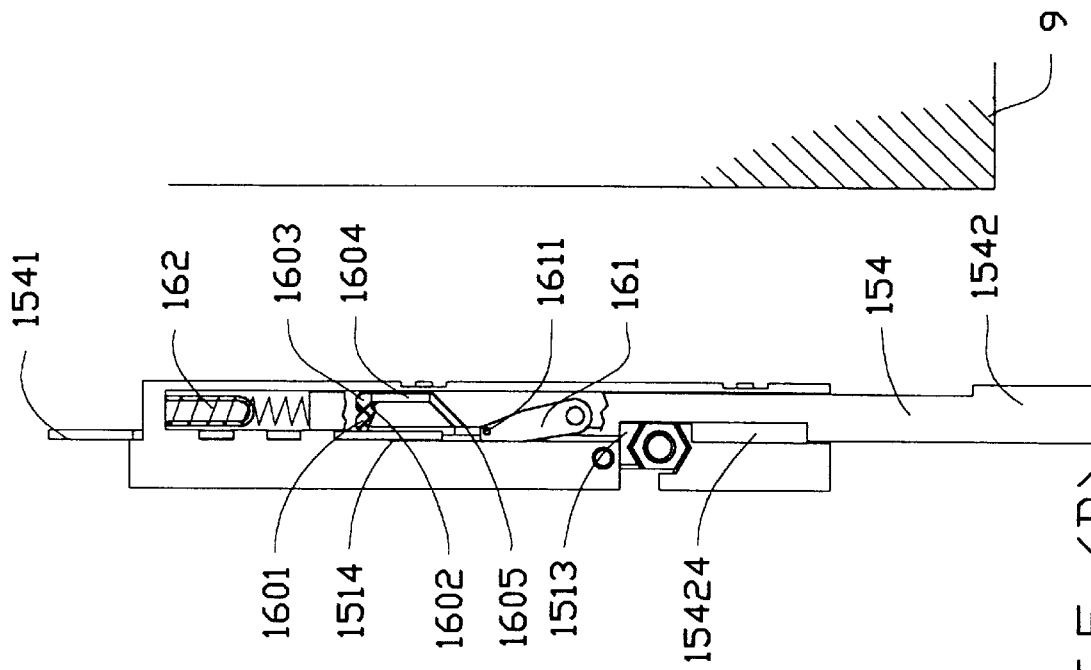
FIG. 5(A) is a diagrammatic view showing the card ejection mechanism at a first position relative to a housing of a computer.
FIG. 5(B) is a view similar to FIG. 5(A) but the card ejection mechanism is at a second position.
FIG. 5(C) is a view similar to FIG. 5(A) but the card ejection mechanism is at a third position.
FIG. 5(D) is a view similar to FIG. 5(A) but the card ejection mechanism is at a fourth position.
Figure 5:
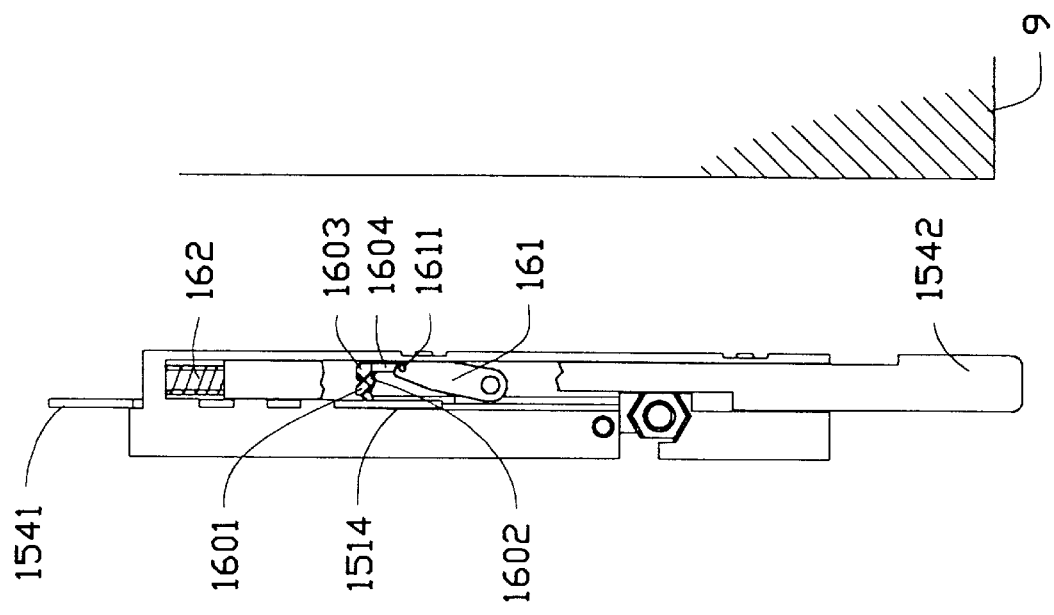
Figure 6:
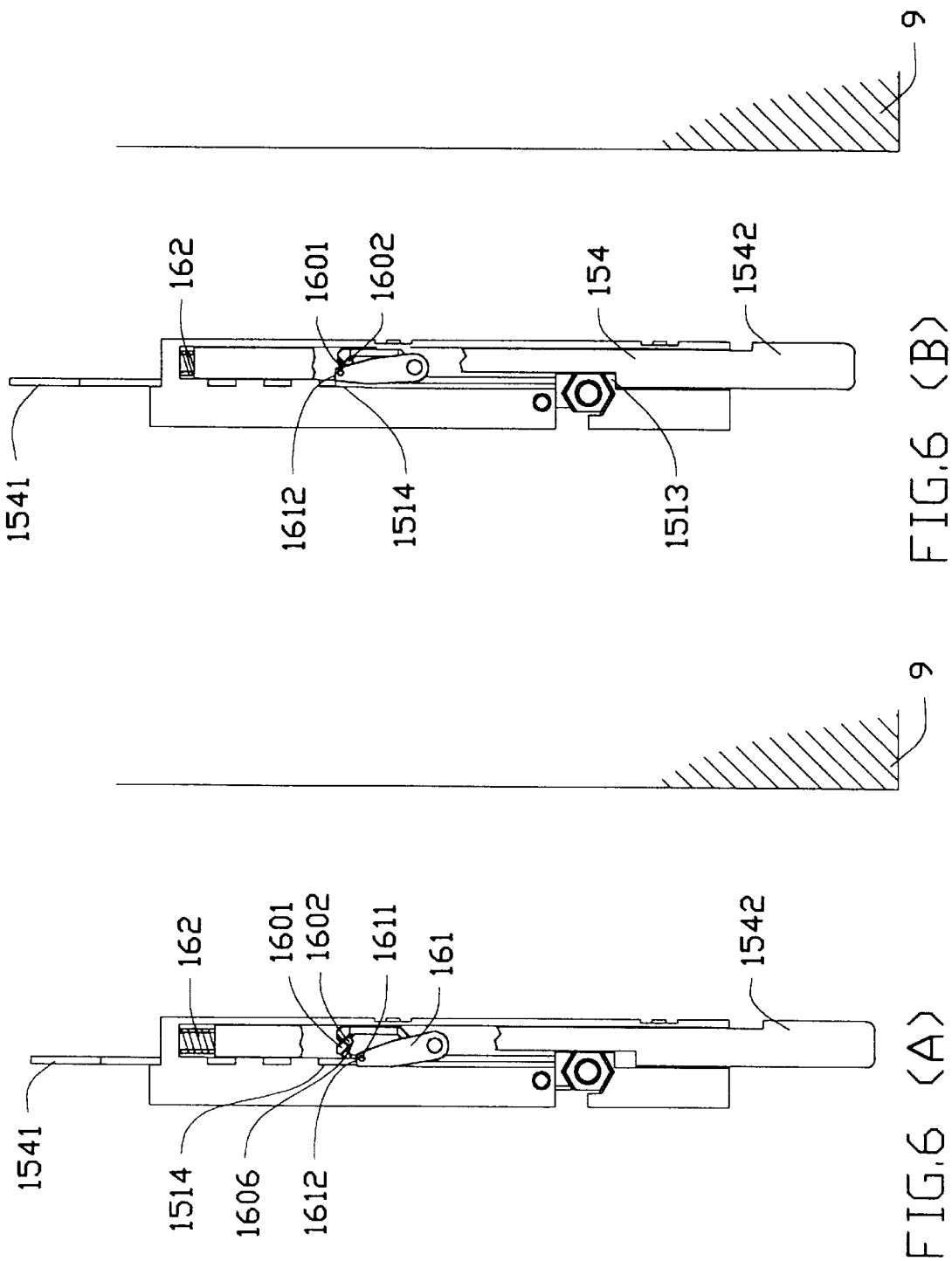
FIG. 6(A) is a view similar to FIG. 5(A) but the card ejection mechanism is at a fifth position.
FIG. 6(B) is a view similar to FIG. 5(A) but the card ejection mechanism is at a sixth position.
Figure 7:
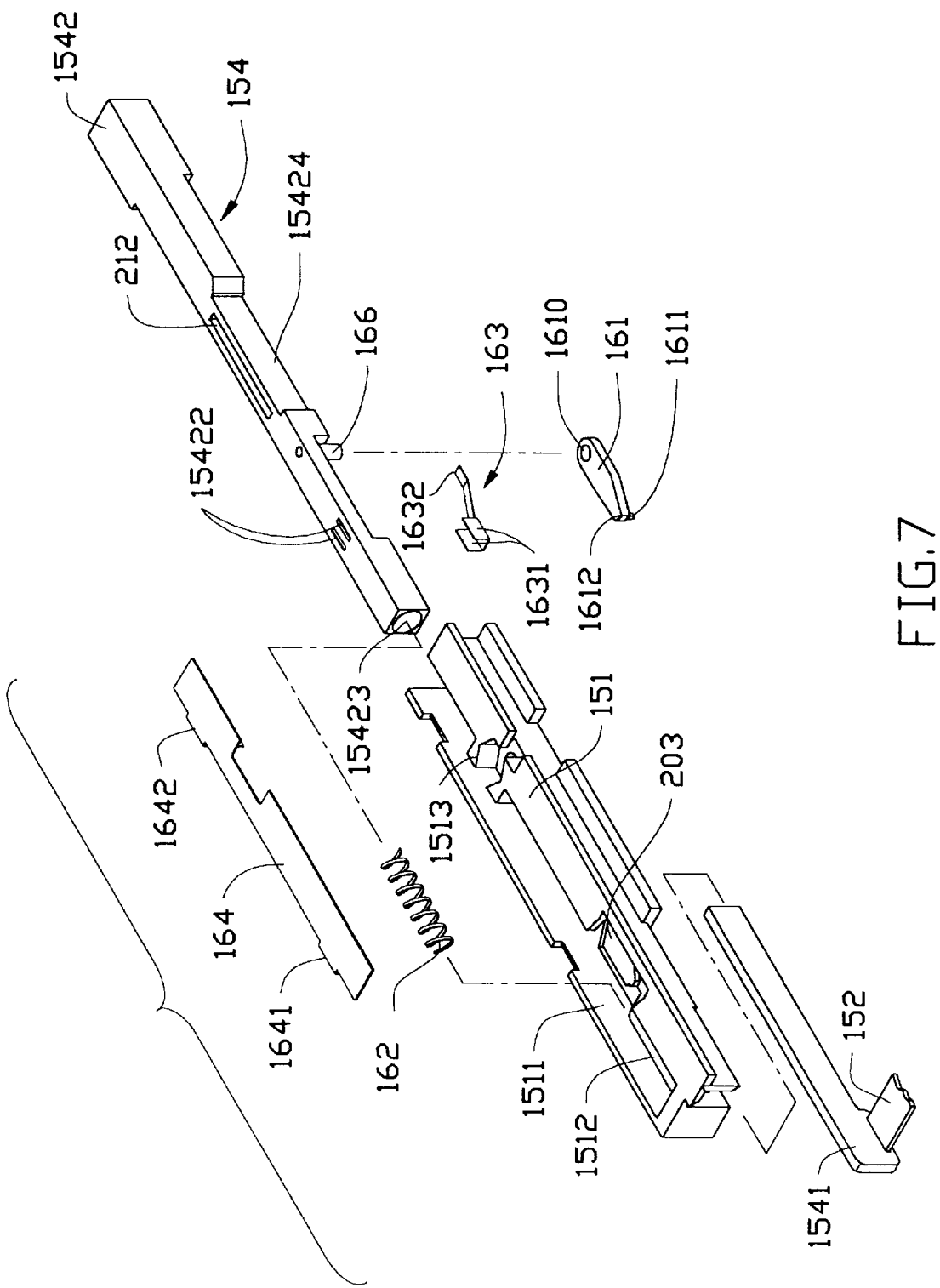
FIG. 7 is an exploded, perspective view of a card ejection mechanism in accordance with a second embodiment of the present invention.
Figure 8:
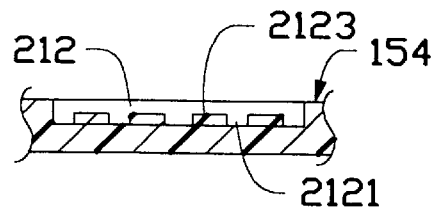
FIG. 8(A) is a top plan view of an actuating arm shown in FIG. 7.
FIG. 8(B) is a cross-sectional view taken along line 8(B)—8(B) of FIG. 8(A)
FIG. 8(C) is a bottom plan view of a cover shown in FIG. 7.
FIG. 8(D) is a side elevational view of FIG. 8(C)
Figure 8:
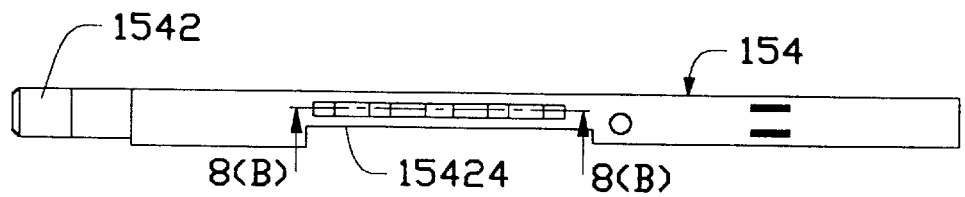
Figure 8:
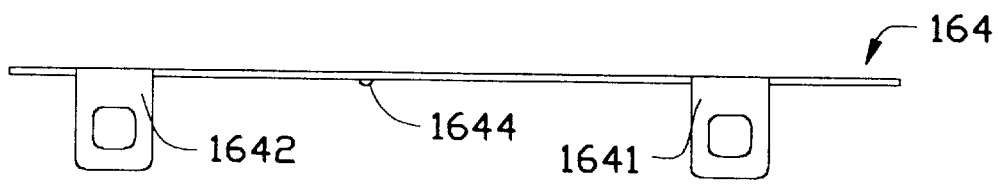
Figure 8:
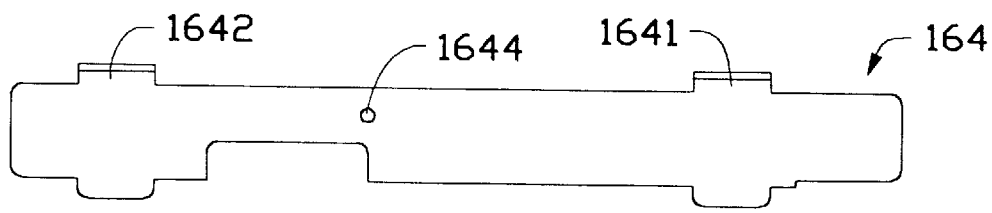
Figure 9:
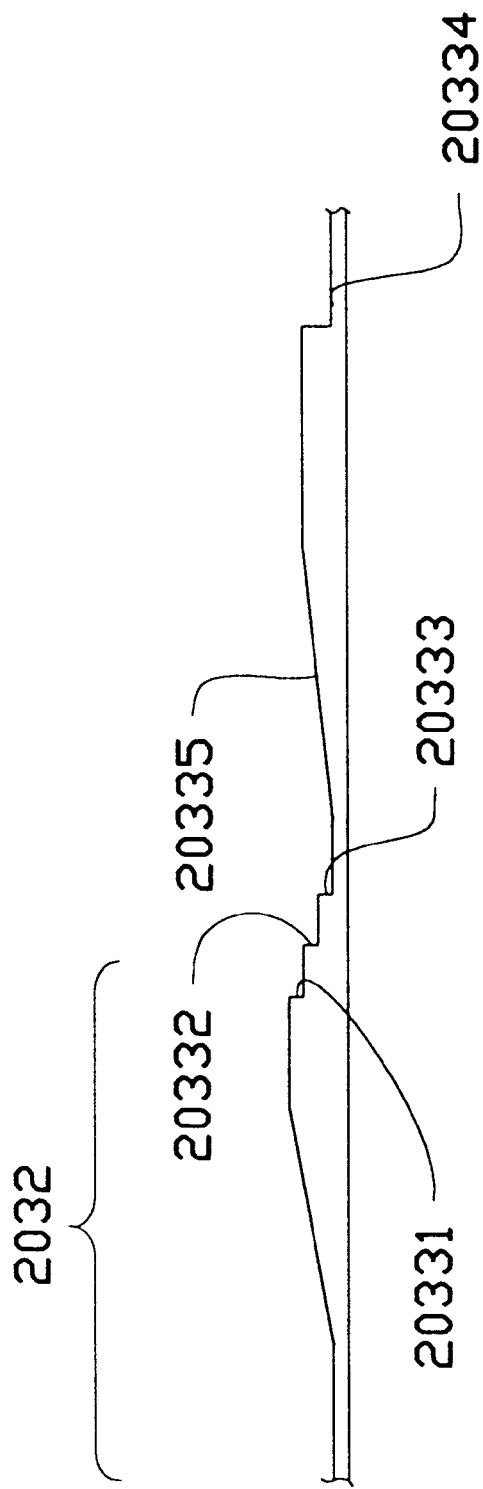
FIG. 9(A) is an enlarged top plan view of a portion of a guiding frame of the card connector in accordance with the second embodiment of the present invention.
FIG. 9(B) is a diagrammatic view showing a profile variation of a part of a bottom wall of the guiding frame shown in FIG. 9(A)
FIG. 9(C) is a diagrammatic view showing a profile variation of another part of a bottom wall of the guiding frame shown in FIG. 9(A)
Figure 10:
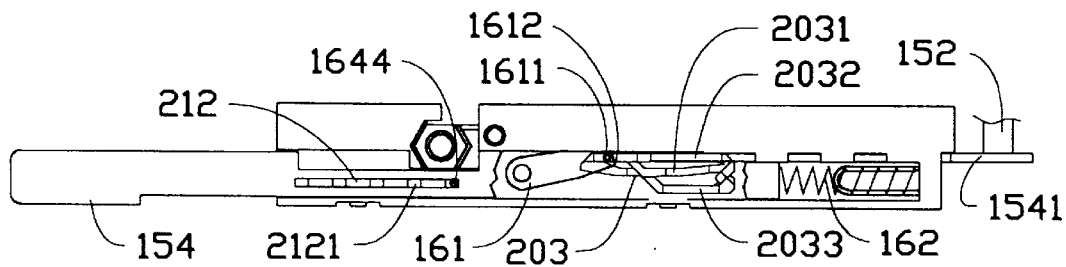
FIGS. 10(A) through 10(H) are diagrammatic views showing successive positions of the card ejection mechanism in accordance with the second embodiment of the present invention.
Figure 10:
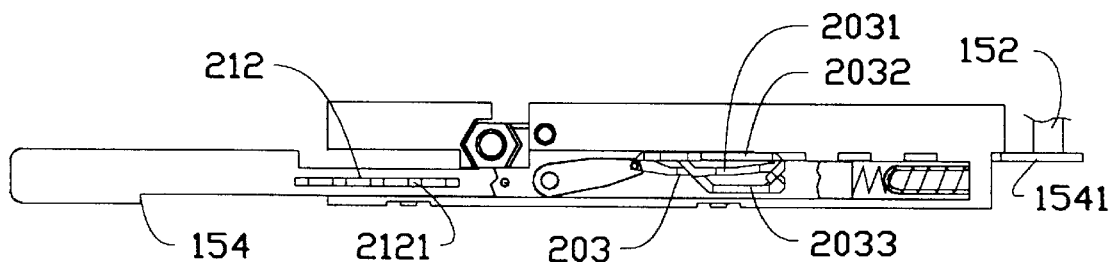
Figure 10:
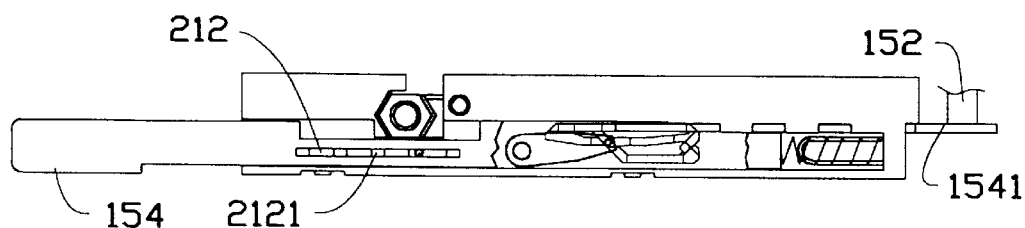
Figure 10:
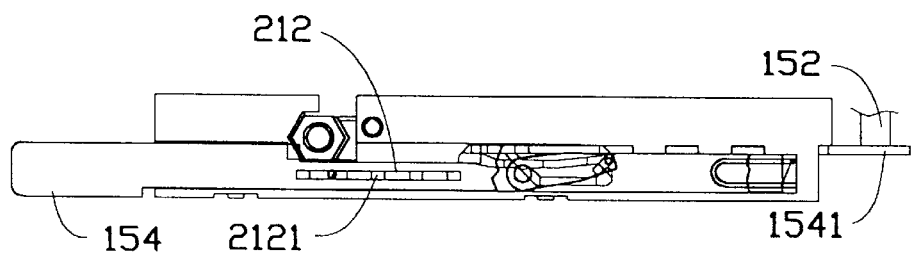
Figure 10:
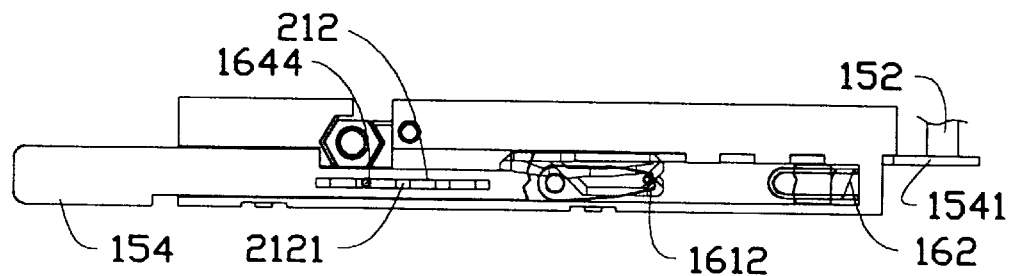
Figure 10:
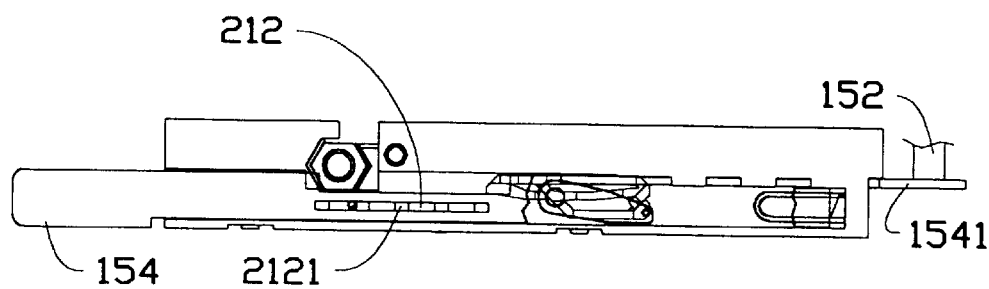
Figure 10:
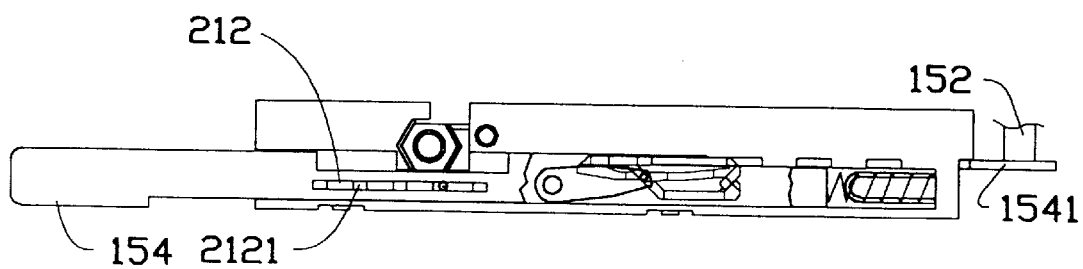
Figure 10:
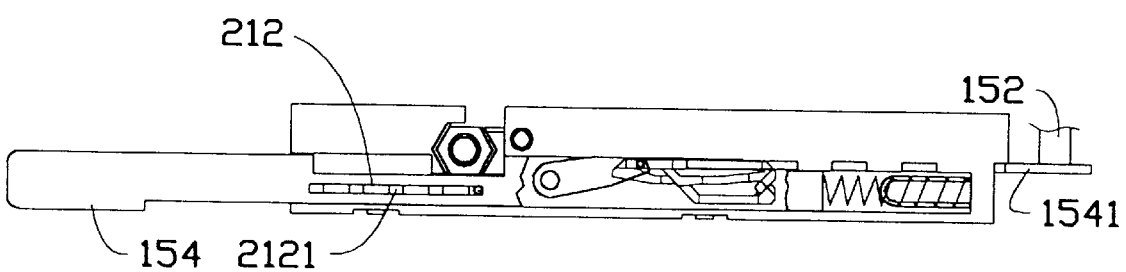
Figure 11:
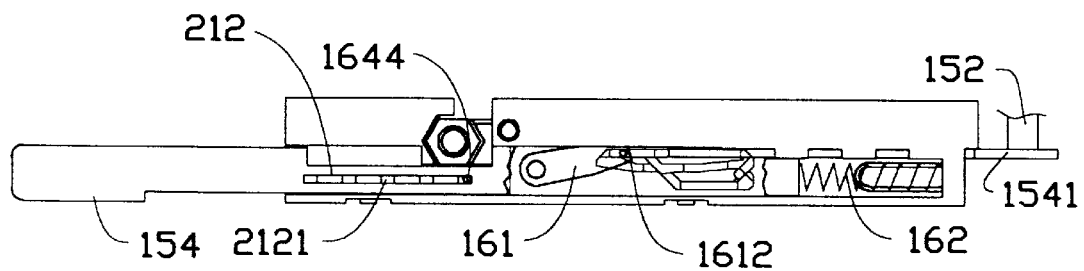
FIGS. 11(A) through 11(H) are diagrammatic views similar to FIGS. 10(A) through 10(H) but show successive positions of the card ejection mechanism according to a second mode of operation.
Figure 11:
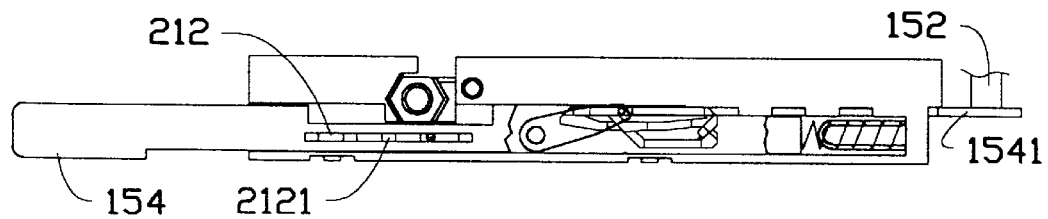
Figure 11:
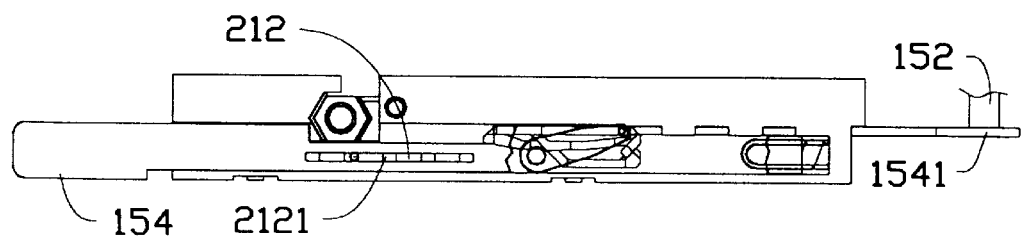
Figure 11:
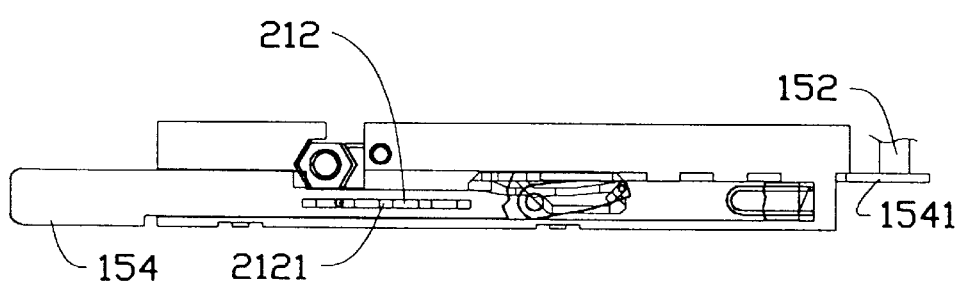
Figure 11:
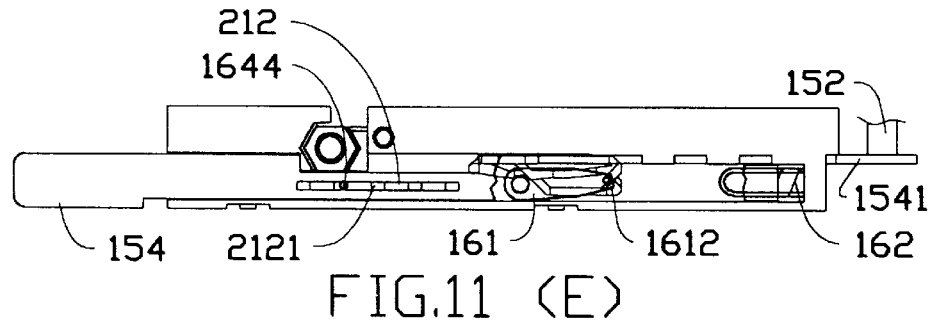
Figure 11:
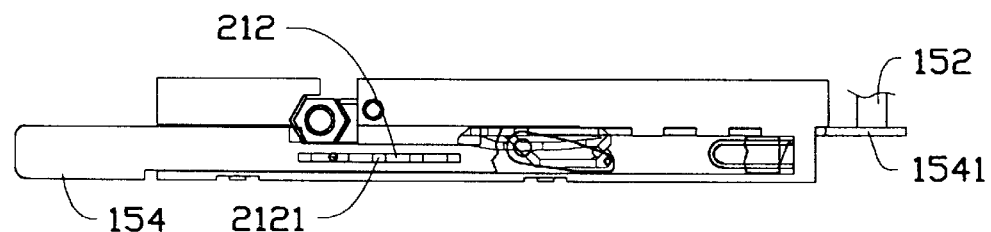
Figure 11:
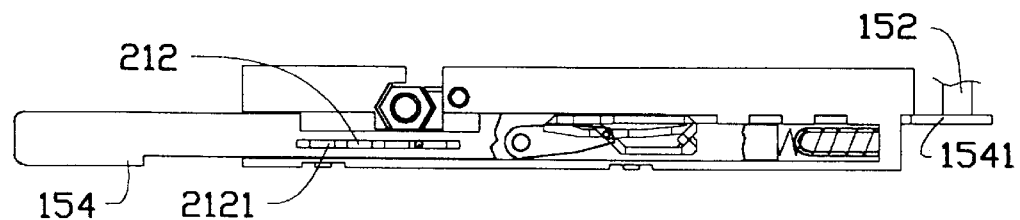
Figure 11:
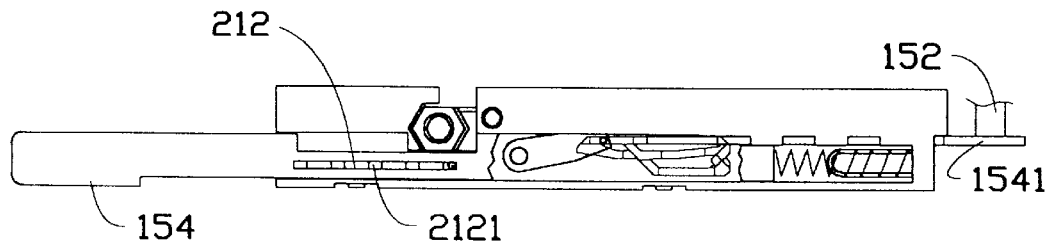

Turning to FIG. 4(A), the positioning groove 160 includes six successively connected positioning groove sections 1601, 1602, 1603, 1604, 1605 and 1606. The positioning groove 160 has a first side near the channel 1514 and a second side opposite the first side. The first positioning groove section 1601 is defined from the first side toward the second side. The second positioning groove section 1062 communicates with the first section 1601 and has an arc-shaped rear edge 16021. The third positioning groove section 1603 is defined from the second section 1602 to the second side. The fourth positioning groove section 1604 is rearwardly defined along the second side from the third section 1603 and then toward the first side. The fifth positioning groove section 1605 communicates with the fourth section 1604 and is further defined along the first side. The sixth positioning groove section 1606 is defined from the fifth section 1605 and communicates with the first section 1601. FIG. 4(B) shows a profile variation of the bottom wall of the left guiding frame 151 defining the six positioning groove sections wherein the third section 1603 has a larger depth than the second section 1602 which has a larger depth than the first section 1601. Such a design ensures that a downward projection 1611 (referring back to FIG. 3(B)) located near a front end 1612 of the follower 161 will move in a direction from the first section 1601 to the third section 1603 via the second section 1602 but not vice versa. Detailed descriptions concerning this feature of the present invention are given below.

Referring to FIGS. 3(B) and 5(A), when the components constituting the card ejection mechanism 15 as shown in FIG. 3(B) are assembled, the downward projection 1611 of the follower 161 extends into the positioning groove 160. A rear portion of the helical spring 162 is received in the depression 15423 whereby the spring 162 exerts a force on the rear actuating arm 154 urging it rearward. The spring tab 1632 between the rear actuating arm 154 and the follower 161 exerts a downward force on the follower 161 urging it downward and ensuring that the downward projection 1611 thereof always extends into the positioning groove 160 to contact the bottom wall of the left guiding frame 151 defining the positioning groove 160.

At the position shown in FIG. 5(A), the downward projection 1611 of the follower 161 is located in the second positioning groove section 1602 and the rearward force of the spring 162 causes the projection 1611 to be matingly received in the arc-shaped rear edge 16021 (FIG. 4(A)), whereby the projection 1611 and thus the follower 161 are fixed in position. Furthermore, at the inner resting position as shown in FIG. 5(A), a card can be inserted into the card connector 1 without moving any components constituting the card ejection mechanism 15. Moreover, the handle 1542 is located in a slot (not labeled) defined by a housing 9 of a computer receiving the card connector 1.

To eject the inserted card (not shown) from the card connector 1, the handle 1542 requires a slight forward force exerted by a user to release the engagement between the projection 1611 and the rear edge 16021 of the second positioning groove section 1602 causing the projection 1611 to enter the third positioning groove section 1603, as shown in FIG. 5(B). When the downward projection 1611 moves to this position, the rearward force exerted by the spring 162 causes the downward projection 1611 to move from the third positioning groove section 1603 through the fourth section 1604 as shown in FIG. 5(C) to reach the fifth section 1605 until a front step (not labeled) formed by the recess 15424 of the rear actuating arm 154 engages with the stop 1513, wherein the card ejection mechanism 15 is at an outer operation position, as shown in FIG. 5(D), causing the handle 1542 to entirely extend outside of the slot defined by the housing 9 of the computer receiving the card connector 1.

Therefore, the user can conveniently access the handle 1542 and exert a force thereon causing the downward projection 1611 to move along the fifth and sixth positioning groove sections 1605, 1606 and the front end 1612 of the follower 161 to engage with and push the front actuating arm 1541 forward to reach a position as shown in FIG. 6(A). During the forward movement of the front actuating arm 1541, the link 152 displaces the card ejection plate (not shown) rearward. Thus, the inserted card is ejected from the connector 1. Further forward movement of the follower 161 induced by pushing the handle 1524 forward causes the downward projection 1611 to enter the first positioning groove section 1601 and a rear step (not labeled) formed by the recess 15424 of the rear actuating arm 154 to engage with the stop 1513, as shown in FIG. 6(B). When the user removes the force acting on the handle 1542, the downward projection 1611 will return to the position as shown in FIG. 5(A) due to the action of the spring 162 and the structural feature of the second groove section 1602 which has a depth larger than that of the first groove section 1601. Thereafter, when a subsequent card is inserted into the connector 1, the front actuating arm 1541 will return to the position as shown in FIG. 5(A).

From the above description, it is understood that the structure of the card ejection mechanism 15 and the card connector 1 in accordance with the present invention is different from the teaching of the prior art. Furthermore, when a user wants to depress the handle 1542 in order to eject an inserted card, the handle 1542 entirely projects out of the slot defined by the housing 9 of the computer receiving the connector 1, so that the handle 1542 can be conveniently accessed to exert a force on the handle 1542.

A second embodiment of the present invention will now be described with reference to FIGS. 7 through 11(A)–11(H). Similar reference numerals are used to represent similar elements throughout the following description.

The card ejection mechanism of the second embodiment differs from the first embodiment mainly in that an alternative positioning groove is added in order to permit a user to move the rear actuating arm 154 which in turn drives the downward projection 1611 of the follower 161 along this alternative positioning groove so that a card in its inserted position will not be ejected. This is required when the actuating arm is actuated, either intentionally or unintentionally, to be in its rearmost position by a user and the user subsequently decides not to eject the card.

As can be seen in FIGS. 7 and 8(A)–8(D), the modification made in the second embodiment includes a positioning slot 212 (best seen in FIGS. 8(A) and 8(B)) defined in the rear actuating arm 154, a positioning protuberance 1644 (best seen in FIGS. 8(C) and 8(D)) formed on the cover 164 to cooperate with the positioning slot 212, and a positioning groove 203 (best seen in FIG. 9(A)) of a different configuration. The other elements shown, including their construction and function, are essentially the same as the first embodiment so that a detailed description thereof is not necessary. The positioning slot 212 has a number of alternating spaces 2121 and steps 2123 which cooperate with the positioning protuberance 1644 by situating the protuberance 1644 within one of the spaces 2121 between two adjacent steps 2123 to finely tune the front and rear position of the rear actuating arm 154.

As shown in FIG. 9(A), in connection with the six successively connected positioning groove sections 1601, 1602, 1603, 1604, 1605 and 1606 described with respect to the first embodiment of the invention, the positioning groove 203 of the present embodiment is basically grouped into three sections, namely the first section 2031, a second section 2032 and a third section 2033 also shown in FIGS. 9(B) and 9(C). The cooperating operation for the second and third sections 2032, 2033 are essentially the same as for the six successively connected positioning groove sections 1601, 1602, 1603, 1604, 1605 and 1606 of the first embodiment. The relative movement of the associated components such as the rear actuating arm 154, the follower 161 and the link 152 are shown successively in FIGS. 11(A)–11(H). The following description will focus on the cooperative relationship between the first and third sections 2031, 2033 which provide an alternative route for the downward projection 1611 of the follower 161 to follow which otherwise would follow a subsequent, readily available movement along the second section 2032.

Starting from the configuration where the downward projection 1611 of the follower 161 is at positioning groove section 20310, in order for the downward projection 1611 to move along the first section 2031 instead of the second section 2032, the rear actuating arm 154 must be moved rearward to cross over step 20311 and reach positioning groove section 20313. From the positioning groove section 20313 onward, upon a forward movement of the actuating arm 154 applied thereto by a user, the downward projection 1611 will sequentially cross over the step 20312 to positioning groove section 20314, then cross over steps 20331, 20332 and finally arrive at positioning groove section 20333. The remaining movement of the downward projection 1611 is the same as in the first embodiment, namely along the positioning groove sections 20334, 20335 back to positioning groove section 20331. It is noted that during the above-described movement of the downward projection 1611, the front actuating arm 1541 is not operated to move. The sequential movement of the relevant components are specifically shown in FIGS. 10(A)–10(H).

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

What is claimed is:

1. A card ejection mechanism for card connector, comprising:

a guiding frame defining an inner space, a positioning groove within the inner space, and a channel, the positioning groove being divided into three main sections defining two closed loops;

a rear actuating arm received in the inner space and slidable between forward and rearward stagnation positions;

a spring for urging the rear actuating arm rearward;

a front actuating arm slidably received in the channel and having a front end adapted to operate a card rejection plate;

a follower pivotably connected to the rear actuating arm and having a projection extending into the positioning groove, the follower being moveable with the rear actuating arm along a selected one of two selected one of the two closed loops the front actuating arm;

a resilient member mounted to the rear actuating arm for retaining the projection of the follower within the positioning groove;

a cover mounted to the guiding frame, the cover having a protuberance, and wherein the guiding frame further has a positioning slot cooperating with the protuberance to regulate a movement of the rear actuating arm;

wherein a rearward force is applied to the rear actuating arm to switch the projection of the follower from within the other of two closed loops to within said one of the two closed loops.

2. A card ejection mechanism for a card connector, comprising:

a first actuating arm adapted to be operated manually from an exterior; and a second actuating arm adapted to actuate ejection of a card in said card connector; wherein the improvement includes:

a first round path and a second round path being defined for cooperation with the first actuating arm in which said first actuating arm travels along the first round path without activating the second activating arm while activates the second activating arm if travel the second round path, the first round path and the second round path share a common path section;

wherein a position provided to enable the first actuating arm to be switched to move along the first round path.

* * * * *